United States Patent
Mori

(10) Patent No.: US 6,911,858 B2
(45) Date of Patent: Jun. 28, 2005

(54) COMPARATOR WITH OFFSET CANCELING FUNCTION AND D/A CONVERSION APPARATUS WITH OFFSET CANCELING FUNCTION

(75) Inventor: Hirokazu Mori, Kawasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 524 days.

(21) Appl. No.: 10/173,164

(22) Filed: Jun. 18, 2002

(65) Prior Publication Data

US 2003/0006920 A1 Jan. 9, 2003

(30) Foreign Application Priority Data

Jun. 22, 2001  (JP) ........................................ 2001-190149

(51) Int. Cl.[7] .............................................. H03L 5/00
(52) U.S. Cl. .......................... 327/307; 327/53; 327/72; 330/9; 330/253
(58) Field of Search .......................... 327/307, 52, 53, 327/72, 73; 330/9, 253, 257–260

(56) References Cited

U.S. PATENT DOCUMENTS

| | | | |
|---|---|---|---|
| 5,017,805 A | | 5/1991 | Kase ........................... 327/88 |
| 5,124,663 A | * | 6/1992 | McEntarfer et al. ........... 330/9 |
| 6,064,262 A | * | 5/2000 | Wang .......................... 330/253 |
| 6,118,395 A | | 9/2000 | Kim ............................. 341/135 |
| 6,362,687 B2 | * | 3/2002 | Cox ............................. 330/253 |
| 6,448,836 B2 | * | 9/2002 | Kokubun et al. ........... 327/307 |
| 6,586,990 B2 | * | 7/2003 | Udo et al. ..................... 330/9 |
| 6,614,301 B2 | * | 9/2003 | Casper et al. ............... 330/253 |

FOREIGN PATENT DOCUMENTS

| | | |
|---|---|---|
| JP | 6-85562 | 3/1994 |
| JP | 11234130 | 8/1999 |

OTHER PUBLICATIONS

English Language Abstract of JP 6–85562.
English Language Abstract of JP 11–234130.

* cited by examiner

Primary Examiner—Terry D. Cunningham
Assistant Examiner—Quan Tra
(74) Attorney, Agent, or Firm—Greenblum & Bernstein, P.L.C.

(57) ABSTRACT

A comparator with an offset canceling function and a D/A conversion apparatus capable of canceling an input/output offset with high accuracy using this comparator. To eliminate unbalance between right and left currents of the differential circuit making up the comparator, the phase of a single end output signal of the differential circuit is inverted and the inverted signal is fed back to one substrate of the differential pair MOS transistors as a substrate bias. Threshold voltages of the MOS transistors are changed and the current capacities of the transistors are adjusted in this way.

11 Claims, 17 Drawing Sheets

COMPARATOR WITH OFFSET CANCELING FUNCTION AND D/A CONVERSION APPARATUS WITH OFFSET CANCELING FUNCTION

BACKGROUND OF THE INVENTION

1. Field of the Invention

The present invention relates to a comparator with an offset canceling function and D/A conversion apparatus with an offset canceling function.

2. Description of the Related Art

A CDMA transmitter converts QPSK-modulated I (in-phase) and Q (quadrature) signals from digital to analog by a D/A converter and sends these signals to an antenna.

An input/output characteristic of the D/A converter (relationship between an input digital value and analog output voltage) should be ideally equal for all D/A converters.

However, an input/output offset is actually produced due to various factors.

When an amount of this offset differs between the D/A converters corresponding to the I signal and Q signal (that is, the two D/A converters have different input/output characteristics), the phases of the I and Q signals are shifted, which results in a transmission error.

Therefore, it is necessary to cancel the input/output offset of the D/A converters so that both D/A converters have a same characteristic.

Canceling the input/output offset of the D/A converters first requires the amount of offset to be measured and a comparator (voltage comparator) is used for this purpose.

Based on the comparison result of this comparator, a control signal to compensate for the offset is obtained to cancel the input/output offset of the D/A converters.

A configuration for canceling such an input/output offset of the D/A converters is described, for example, in the Unexamined Japanese Patent Publication No.HEI 11-234130.

As described above, it is necessary to measure the amount of offset using a comparator in order to cancel the input/output offset of the D/A converters.

For measurement of a correct amount of offset, it is naturally important that the offset of the comparator itself should remain within a predetermined range.

The comparator (voltage comparator) is mainly constructed of a differential amplifier.

A differential amplifier (differential circuit) is designed so as to balance current capacities on the right and left. However, an offset (characteristic variation of transistors forming a differential pair) is normally produced due to variations in size, etc. of transistors that actually make up the differential amplification circuit.

The amount of offset of the comparator varies considerably.

An investigation conducted by the inventor of the present invention shows that the amount of offset sometimes goes beyond its allowable range a great deal.

Furthermore, it has been confirmed that in the case where the input/output offset of D/A converters is adjusted using a comparator whose offset exceeds such an allowable range, that is, in the case where the offset of the D/A converters is canceled by feedback control using a low accuracy comparator, an offset of 20 mV or more would still remain, which should originally remain within several mv.

To solve such a problem, it is necessary to cancel the offset (offset between right and left current capacities) of the comparator used for that purpose before canceling the input/output offset of the D/A converters.

However, it is actually difficult to provide a dedicated circuit only for offset cancellation of the comparator from the standpoint of preventing an expansion of the area occupied by a semiconductor apparatus (IC) or from the standpoint of a demand for low power consumption, etc.

SUMMARY OF THE INVENTION

It is an object of the present invention to implement a comparator in a simple configuration having an offset canceling function for automatically adjusting offsets, and to adjust offsets of D/A converters with high accuracy.

The comparator of the present invention makes it possible to selectively switch between a normal operating mode and offset canceling mode.

The comparator of the present invention further inverts the phase of an output signal of a differential circuit in an offset canceling mode and allows the inverted signal to be fed back to the substrate of one differential pair MOS transistor as a substrate bias. Thus, a threshold voltage of the MOS transistor is changed and the current capacity of the transistor is adjusted.

One aspect of the comparator of the present invention is to use a current mirror as a load for the transistors forming a differential pair (referred to as "differential pair transistors" or sometimes referred to as "input stage transistors"), receive a single end output of the current mirror by an output stage transistor (e.g., source-grounded MOS transistor) and obtain the output signal of the comparator from this output stage transistor.

Then, in an offset canceling mode, the output voltage of the comparator is supplied as a substrate bias of the transistor that receives the received signal out of the differential pair transistors.

By feeding back the output voltage of the comparator as the substrate bias of the input stage transistor, the following effects can be obtained.

Suppose a same voltage is applied to both transistors forming the differential pair. Also suppose an unbalance (that is, offset) in the amount of current that flows through the respective transistors is produced due to characteristic variations in the transistors.

The potential at the output end of the current mirror, which is the load of the differential pair transistors changes by an amount corresponding to the offset, the potential variation is inverted by the above-described output stage transistor and the inverted voltage is supplied as a substrate bias.

As a result, the substrate potential of the input stage transistor (potential of the semiconductor substrate) changes. When the substrate potential changes, the threshold voltage (Vth) of the MOS transistor changes due to a so-called substrate bias effect, and as a result, the amount of current that flows through the transistor changes. This reduces the current offset.

Thus, according to an aspect of the present invention, a negative feedback loop is formed and the current offset is corrected by negative feedback control.

The present invention allows the comparator offset to be canceled by adding almost no extra elements.

However, in the case where a parasitic diode turns ON in the process of changing the substrate bias in the positive direction or negative direction, the constant voltage characteristic of the diode causes the substrate voltage to be clamped, preventing a desired substrate bias from being provided.

To prevent this problem, in another aspect of the present invention, transistors of different sizes (channel conductance: W/L) are used to form a differential pair to intentionally provide an offset between the right and left current capacities in the initial state.

This causes the dynamic range of the substrate bias to remain within a range in which the parasitic diode does not turn ON. This ensures that the parasitic diode is prevented from turning ON.

When offset cancellation is implemented for the D/A converter using the comparator with an offset canceling function in such a simplified configuration, it is possible to adjust offsets with extremely high accuracy.

This allows adjustments of input/output offsets of the D/A conversion apparatus with significantly high accuracy.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE PREFERRED EMBODIMENTS (Embodiment 1)

Figure 1:
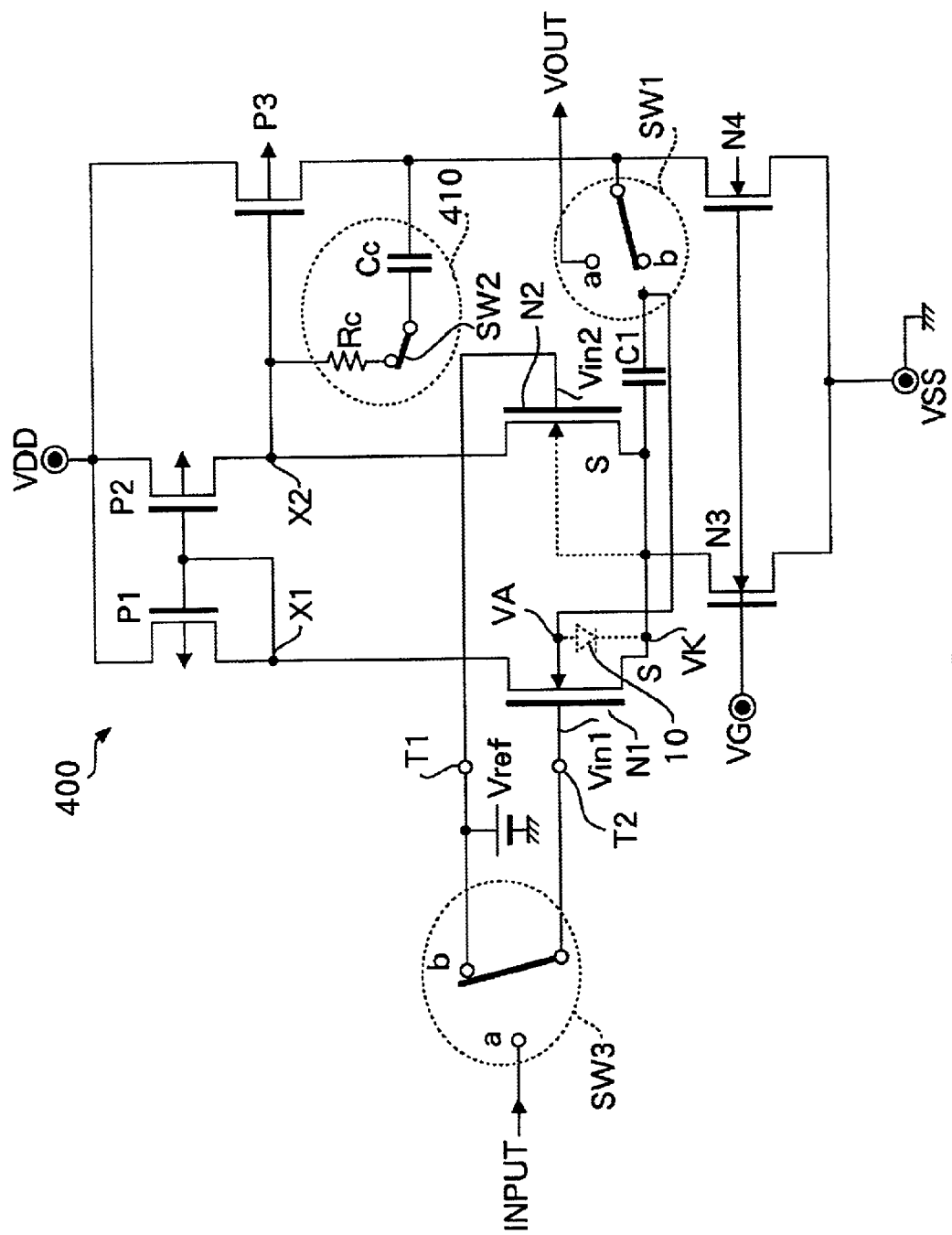
FIG. 1 is a circuit diagram showing a configuration example of a comparator with an offset canceling function of the present invention.

FIG. 1 is a circuit diagram showing a configuration example of a comparator with an offset canceling function of the present invention.

As illustrated, this comparator is constructed of NMOS transistors N1 and N2 forming a differential pair, constant current source transistor N3, load transistors (PMOS transistors) P1 and P2 forming a current mirror, output stage transistors (made up of PMOS transistor P3 and constant current source transistor N4) forming a push-pull type output stage circuit, phase adjustment circuit 410 (made up of phase adjustment resistor Rc, phase adjustment capacitance Cc and switch SW2 which turns ON during an offset adjustment), capacitor C1 and switches SW1 and SW3.

One differential pair transistor N1 is fed an input voltage (INPUT) or a reference voltage (also referred to as "bias voltage": Vref) through input terminal T1.

The other differential pair transistor (N2) is always fed the reference voltage (Vref) through input terminal T2.

"N" used in the naming of each transistor described in FIG. 1 denotes an N-type MOS transistor and "P" denotes a P-type MOS transistor. VDD denotes a supply voltage (e.g. 3 V) and VSS denotes a minimum potential (GND) of the circuit.

Switches SW1 to SW3 are provided to selectively switch between a normal operating mode and offset adjusting mode.

Switch SW3 which receives an input signal (INPUT) is set to the a terminal side during a normal operation and set to the b terminal side in an offset canceling mode.

Likewise, switch SW1 is set to the a terminal side during a normal operation and set to the b terminal side in an offset canceling mode.

On the other hand, switch SW2 is ON in an offset canceling mode and OFF during a normal operation as a comparator. This switch setting is performed for the following reasons:

That is, when negative feedback control is performed for offset cancellation, a control signal for controlling a substrate bias should change linearly. That is, an operation of the linear area of the analog circuit is required.

Therefore, switch SW2 is turned ON in an offset canceling mode to activate phase adjustment circuit 410. This allows the comparator to operate as an operational amplifier (of-amp).

In FIG. 1, capacitor C1 functions as a DC cut capacitor, which prevents the substrate bias of NMOS transistor N1 from having an influence on the source potential or the substrate potential of NMOS transistor N2.

This capacitor C1 also functions as a holding capacitor, which keeps supplying an adjusted voltage to the substrate of NMOS transistor N1 for at least a predetermined time even after switches SW1 and SW3 are set to the a terminal side after an offset adjustment is completed.

Figure 2:
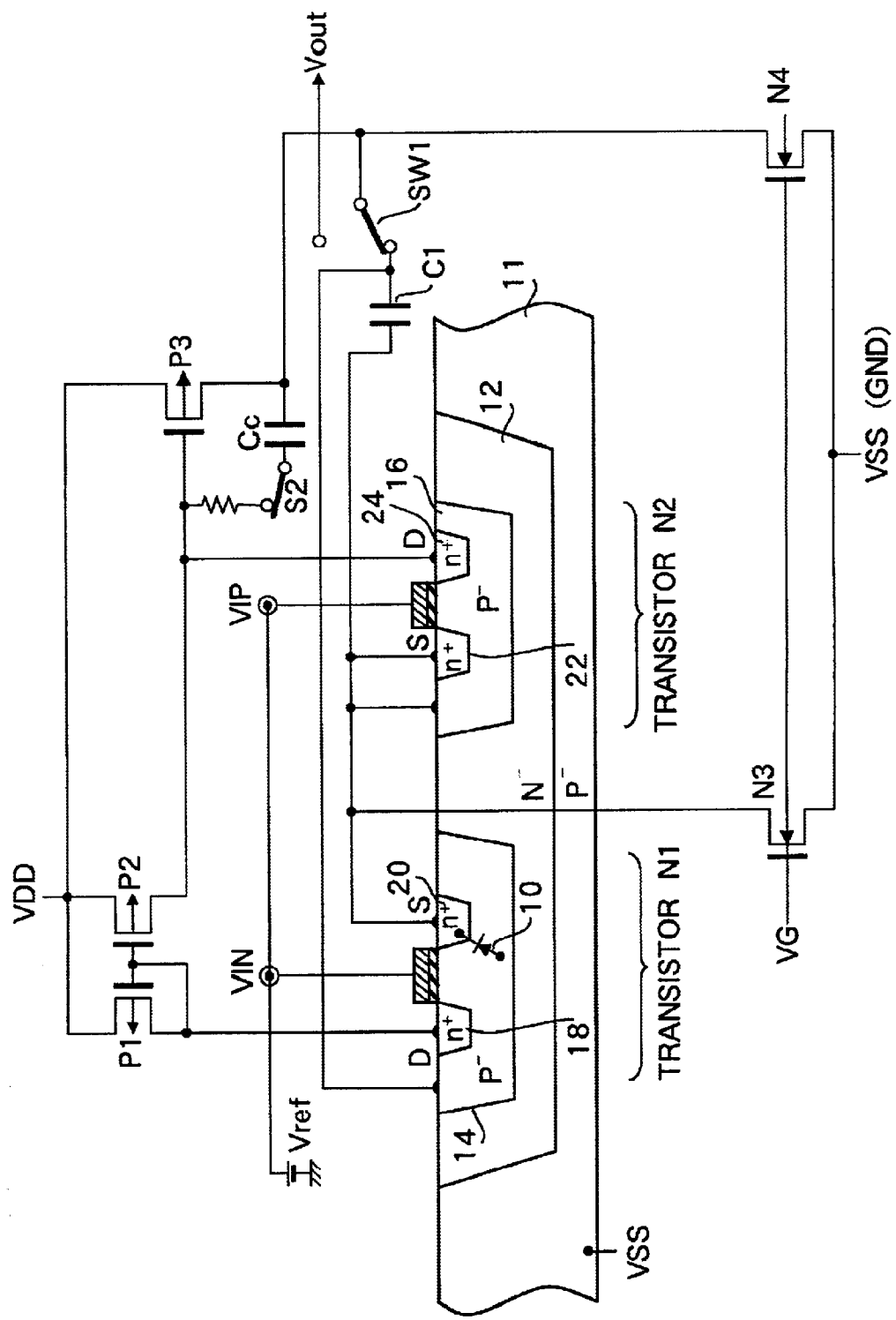
FIG. 2 is a cross-sectional view showing a cross-sectional structure of two transistor devices forming a differential pair in the semiconductor integrated circuit apparatus incorporating the comparator in FIG. 1.

FIG. 2 shows a cross-sectional structure of the semiconductor devices of the transistors (N1, N2) forming a differential pair of the circuit in FIG. 1.

As illustrated, a double well structure is adopted. N-type well 12 is formed inside P-type substrate 11 and P-type wells 14 and 16 are formed inside the N-type well.

Then, source and drain layers (18, 20, 22, 24) are formed inside P-type wells 14 and 16.

Transistor N1 is shown at the left of FIG. 2 and transistor N2 is shown at the right.

In FIG. 2, the substrate bias of transistor N1 refers to the voltage of P-type well 14.

Furthermore, as will be explained later, it is preferable to make the size of differential pair transistor N1 bigger than that of differential pair transistor N2 (this will be described later using FIG. 6 and FIG. 7).

Operations of the comparator of the present invention during an offset adjustment shown in FIG. 1 will be explained one by one in detail using FIG. 3 to FIG. 7.

The circuits in FIG. 3 to FIG. 6 are completely the same as the circuit in FIG. 1.

The circuits in FIG. 3 to FIG. 6 are created with consideration given to making them easier to understand than FIG. 1.

Furthermore, in FIG. 3 to FIG. 6, the constant current source transistors (N3, N4) in FIG. 1 are described simplified as constant current sources (ISW1, ISW2) respectively.

Furthermore, as will be explained later, it is preferable to make the size (that is, channel conductance of the MOS transistor: W/L) of differential pair transistor N1 bigger than (e.g., double) the size of differential pair transistor N2.

However, since a current mirror load is used, the amount of current in the left path of the differential circuit is theoretically equal to the amount of current in the right path irrespective of the sizes of the differential pair transistors (N1, N2). This aspect should be noted.

Figure 3:
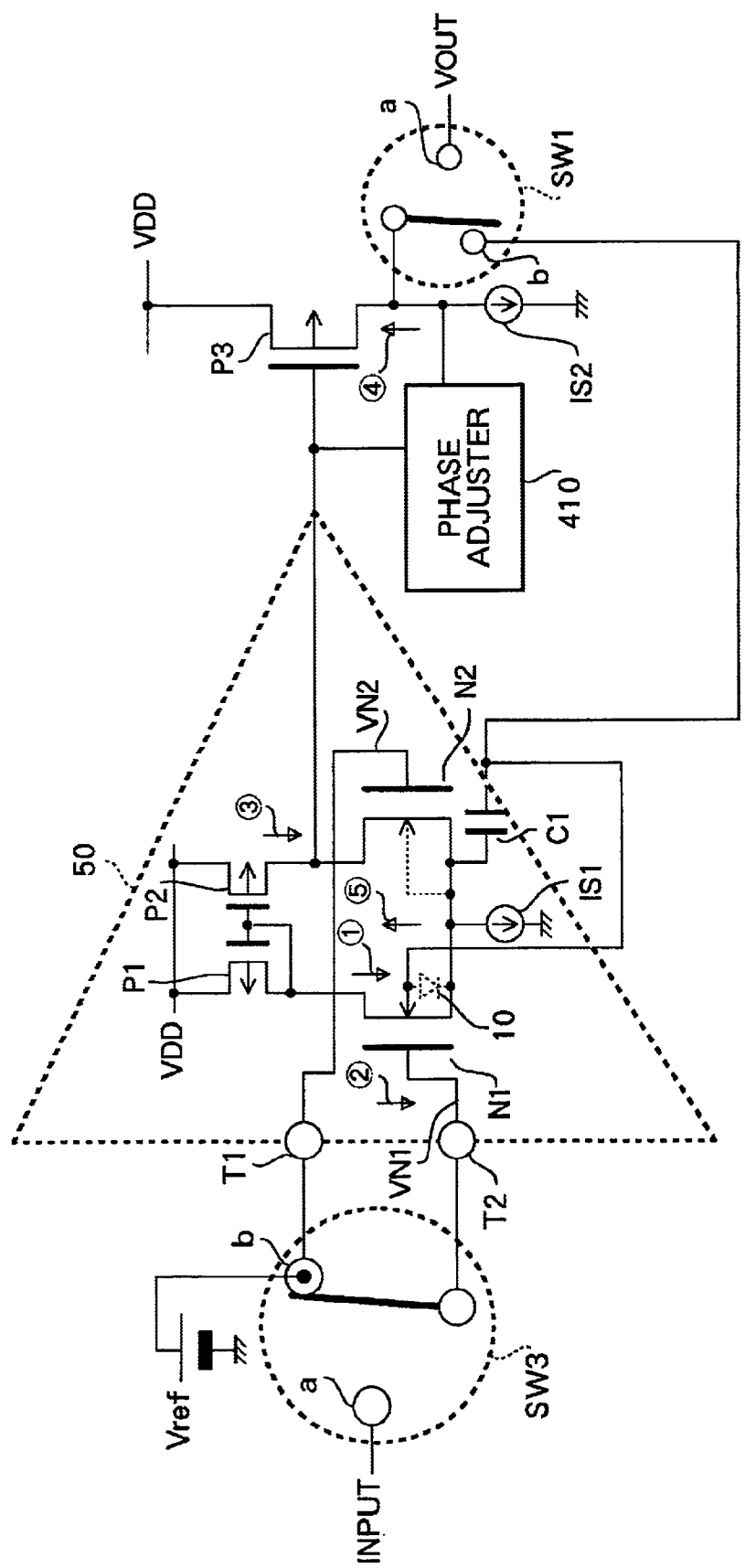
FIG. 3 is a circuit diagram illustrating an operation whereby a substrate potential of the differential pair transistor (N1) of the comparator with an offset canceling function shown in FIG. 1 is automatically adjusted through negative feedback control.

In an offset adjusting mode, switch SW1 is changed to the b terminal side as shown in FIG. 3.

This causes gate voltages Vin1 and Vin2 of differential pair transistors N1 and N2 to be fixed to reference voltage Vref.

As described above, the left side and the right side of the differential circuit have the same amount of current theoretically, but unbalance is produced due to various factors.

The present invention allows the system to be automatically adjusted so that this unbalance is eliminated.

This adjustment is realized by changing the substrate bias of the MOS transistors.

Before entering into further details, a relationship between threshold Vth of an MOS transistor and a substrate bias will be explained.

Threshold voltage Vth of an NMOS transistor is expressed as shown in Expression (1) below:

$$Vth = 2 \cdot B + \{2 \cdot S \cdot qNA(2 \cdot B + VBS)\}^{1/2} / Ci \qquad (1)$$

where .B is a potential of the substrate, S is permittivity of silicon, q is unit charge, NA is concentration of impurities of the substrate, VBS is a potential difference between the substrate and source and Ci is a gate capacitance.

After all, threshold voltage Vth is dependent on source potential VBS (that is, the potential of the source relative to the substrate) and threshold voltage (reverse voltage) Vth increases as this value increases.

Here, increasing the source potential with the substrate potential fixed is equivalent to decreasing the substrate potential with the source potential fixed and both cases cause the source potential to increase when viewed from the substrate potential.

In this case, threshold Vth increases according to Expression (1) above.

Various auto offset adjustment operations will be explained in detail with reference to FIG. 3 to FIG. 7.

(1) Operation of adjusting substrate potential

First, an operation for automatically adjusting the substrate potential of differential pair transistor (NMOS transistor: hereinafter simply described as "transistor") N1 will be explained using FIG. 3.

In FIG. 3, changes of voltages at predetermined locations of the circuit are shown with arrows numbered ① to ⑤ to facilitate an understanding of the negative feedback operation. Upward arrows each indicate a voltage rise and downward arrows each indicate a voltage drop.

In the case of the comparator in FIG. 3 (which functions as an operational amplifier when phase adjuster 410 is ON), the substrate potential of transistor N1 is not fixed. Therefore, the substrate potential of transistor N1 is not determined in an initial state, which puts the circuit in an unstable state.

Thus, in an adjusting mode, the substrate potential of transistor N1 is adjusted first.

First, switch SW1 is connected to the b side and switch SW2 is set to ON to activate phase adjustment circuit 410.

In the following explanations, suppose Vin1=Vin2, transistors P1 and P2 have a same characteristic and transistors N1 and N2 have a same characteristic as prerequisites.

As described above, the substrate potential of transistor N1 is not fixed. Therefore, the substrate potential of transistor N1 is not determined in an initial state, which puts the circuit in an unstable state.

Suppose the substrate potential of transistor N1 is lower than the substrate potential of transistor N2 (arrow ① in FIG. 3). Then, threshold voltage Vth of transistor N1 increases as described above. Therefore, the current capacity of transistor N1 is lower than the current capacity of transistor N2.

This state is equivalent to the gate voltage (VN1) of transistor N1 being lower than the gate voltage (VN2) of transistor N2 (arrow ② in FIG. 3).

Since the output signal of differential amplification circuit 50 (shown by a triangle with thick arrows in FIG. 3) is in phase with the input signal, the output signal of differential amplification circuit 50 also decreases (arrow ③ in FIG. 3).

The voltage level of the output signal of differential amplification circuit 50 is inverted by a source-grounded PMOS transistor (P3).

Therefore, the level of the output voltage of the source-grounded PMOS transistor (P3) increases (arrow ④ in FIG. 3).

Currently, switch SW1 is set to the b side.

Therefore, the output voltage of the source-grounded PMOS transistor (P3) is fed back as the substrate bias of differential pair transistor N1 inside differential amplification circuit 50.

Therefore, the output voltage of the source-grounded PMOS transistor (P3) becomes the substrate potential of differential pair transistor N1 as it is. Therefore, the substrate potential of transistor N1 increases (arrow ⑤ in FIG. 3).

This operation is repeated, and after all, the substrate potential of transistor N1 becomes equal to the substrate potential of transistor N2, which stabilizes transistor N1.

This operation means that the substrate potential of transistor N1 is adjusted so that the left side system (P1-N1 system) and the right side system (P2-N2 system) of the differential amplification circuit have the same characteristic under the condition of Vin1=Vin2.

(2) Operation of adjusting current capacity offset of differential pair transistors Due to variations involved in manufacturing of transistors, offsets are often produced in the current capacities of the differential pair transistors (N1, N2). An operation of adjusting a current capacity offset of the differential pair transistors will be explained using FIG. 4.

Here, suppose a case where differential pair transistor N1 (transistor at left) has a higher current capacity than that of transistor N2 (transistor at right).

Figure 4:
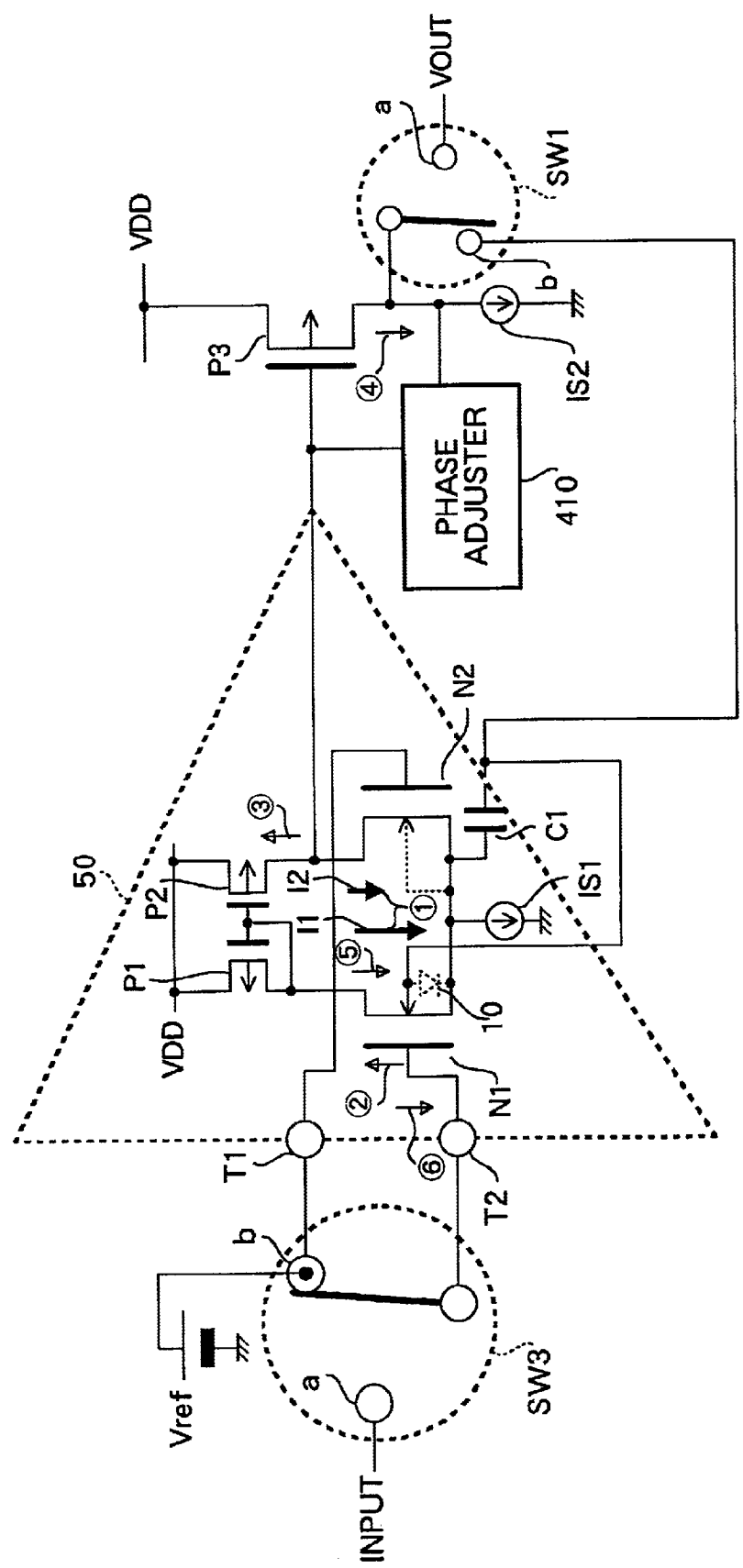
FIG. 4 is a circuit diagram illustrating an operation whereby an offset between current capacities of the differential pair transistors (N1, N2) (current capacity of N1>current capacity of N2) of the comparator with an offset canceling function shown in FIG. 1 is automatically adjusted through negative feedback control.

That is, as described in FIG. 4, the amount of current I1 that flows through the left system of the differential circuit is greater than the amount of current I2 that flows through the right system (arrow ① in FIG. 4).

Such a state is the same as the state in which the gate voltage of transistor N1 is greater than the gate voltage of transistor N2 (arrow ② in FIG. 4).

Therefore, the voltage level of the single end output of the differential circuit rises (arrow ③ in FIG. 4).

Therefore, the level of the output signal of source-grounded transistor P3 drops (arrow ④ in FIG. 4). The output voltage of transistor P3 becomes the substrate potential of differential pair transistor N1 as it is.

Thus, the substrate potential of transistor N1 drops (arrow ⑤ in FIG. 4). As a result, threshold voltage Vth of transistor N1 rises and the current capacity of transistor N1 decreases.

This is practically equivalent to the gate voltage of differential pair transistor N1 dropping (arrow ⑥ in FIG. 4).

Such a negative feedback operation is repeated and it is when transistor N1 has the same characteristic as that of transistor N2 that the circuit state becomes stable.

This means that the substrate potential of transistor N1 is adjusted so that the right and left systems of the differential circuit have the same characteristic under the condition that the differential pair transistors N1 and N2 have the same gate voltage.

(3) Operation of adjusting current offset of current mirror

Next, suppose a case where the current capacity of transistor P1 making up the current mirror is lower than the current capacity of transistor P2. An operation of adjusting a current offset of the current mirror in this case will be explained using FIG. 5.

That current I1 that flows through transistor P1 is smaller than current I2 that flows through transistor P2 means that while the differential pair transistors N1 and N2 are pulling the same amount of current, the current supply from supply potential VDD at the left system is smaller than that of the right system.

Figure 5:
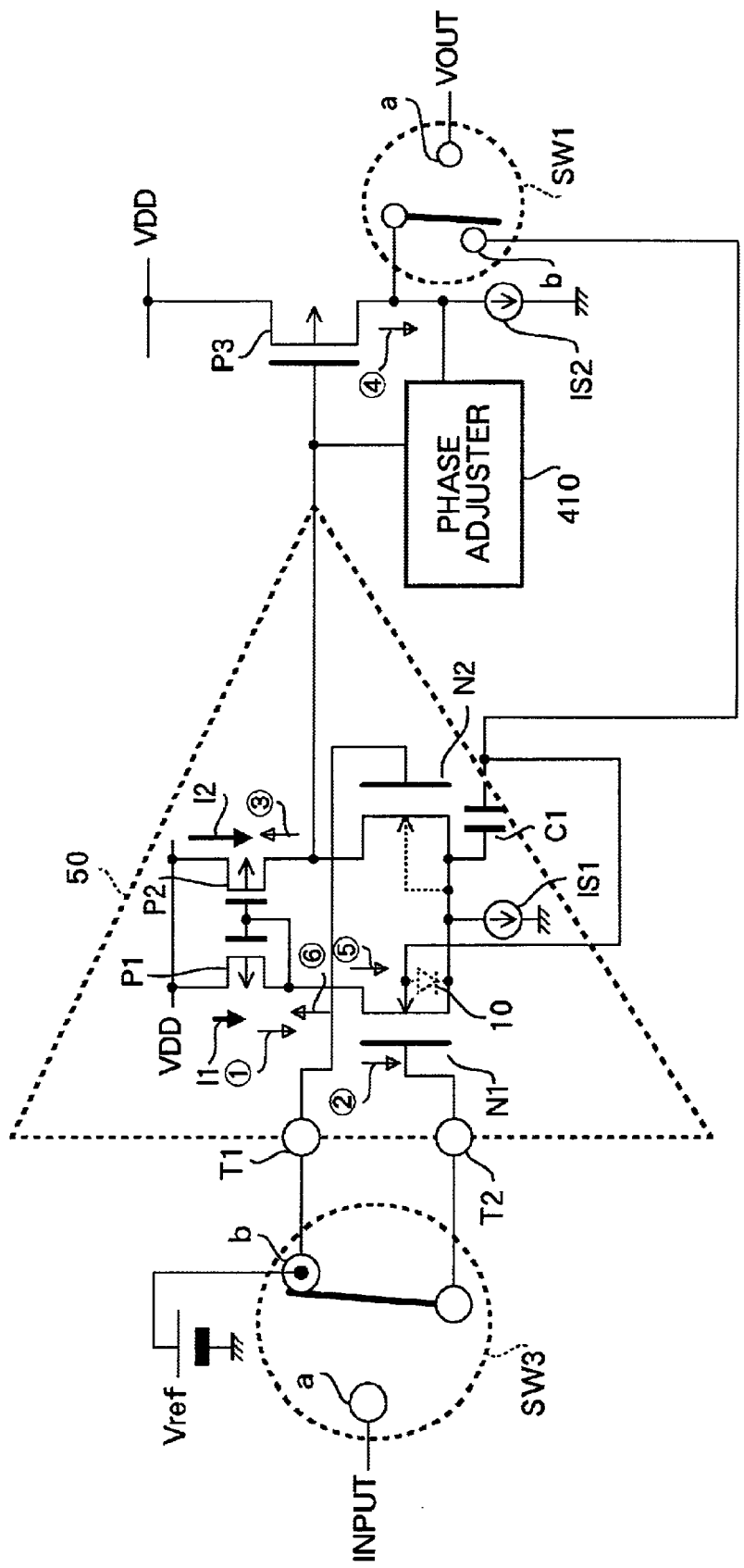
FIG. 5 is a circuit diagram illustrating an operation whereby an offset between current capacities of a current mirror (P1, P2) (current capacity of P1<current capacity of P2) of the comparator with an offset canceling function shown in FIG. 1 is automatically adjusted through negative feedback control.

Thus, the drain voltage of transistor P1 is lower than the drain voltage of transistor P2 (arrow ① in FIG. 5).

That is, the drain voltage of differential pair transistor N1 is lower than the drain voltage of differential pair transistor N2. This state is equivalent to the gate voltage of transistor N1 being higher than the gate voltage of transistor N2 (arrow ② in FIG. 5).

Thus, the voltage level of the single end output signal of the differential circuit rises (arrow ③ in FIG. 5).

Therefore, the voltage level of the output signal of source-grounded transistor P3 drops (arrow ④ in FIG. 5).

Thus, the substrate potential of transistor N1 drops (arrow ⑤ in FIG. 5). When the substrate potential of transistor N1 is lower than the substrate potential of transistor N2, threshold voltage Vth of transistor N1 rises and the current capacity of transistor N1 decreases.

When the current capacity of transistor N1 decreases the drain voltage of differential pair transistor N1 rises. That is, the drain voltage of transistor P1 making up the current mirror rises (arrow ⑥ in FIG. 5).

Thus, when transistors P1 and P2 have different characteristics, or when transistors N1 and N2 have different characteristics, the substrate potential of differential pair transistor N1 is automatically adjusted so that the left system (system including transistors P1 and N1) of the differential circuit has the same characteristic as the right system (system including transistors P2 and N2) on condition that differential pair transistors N1 and N2 have the same gate voltage (Vin1=Vin2).

The above explanation presupposes that the differential pair transistors (N1, N2) have the same input level.

Therefore, an automatic adjustment is carried out so that the current offset between the right and left systems of the differential circuit becomes zero on condition that the inputs to the differential circuit have the same level.

(4) Operation of adjusting substrate potential of transistor N1 when offset is provided between levels of two input signals for differential circuit to prevent parasitic diode from turning ON A case where a condition: Vin1=Vin2+α is given will be explained with reference to FIG. 6 below.

In this case, the substrate potential of transistor N1 is adjusted so that that the left system (including transistors P1 and N1) of the differential circuit has the same characteristic as the right system (including transistors P2 and N2) on condition: Vin1=Vin2+α.

That is, when Vin1=Vin2+α, the characteristic of the differential circuit is automatically adjusted so that the current offset between the right and left systems becomes zero.

Figure 6:
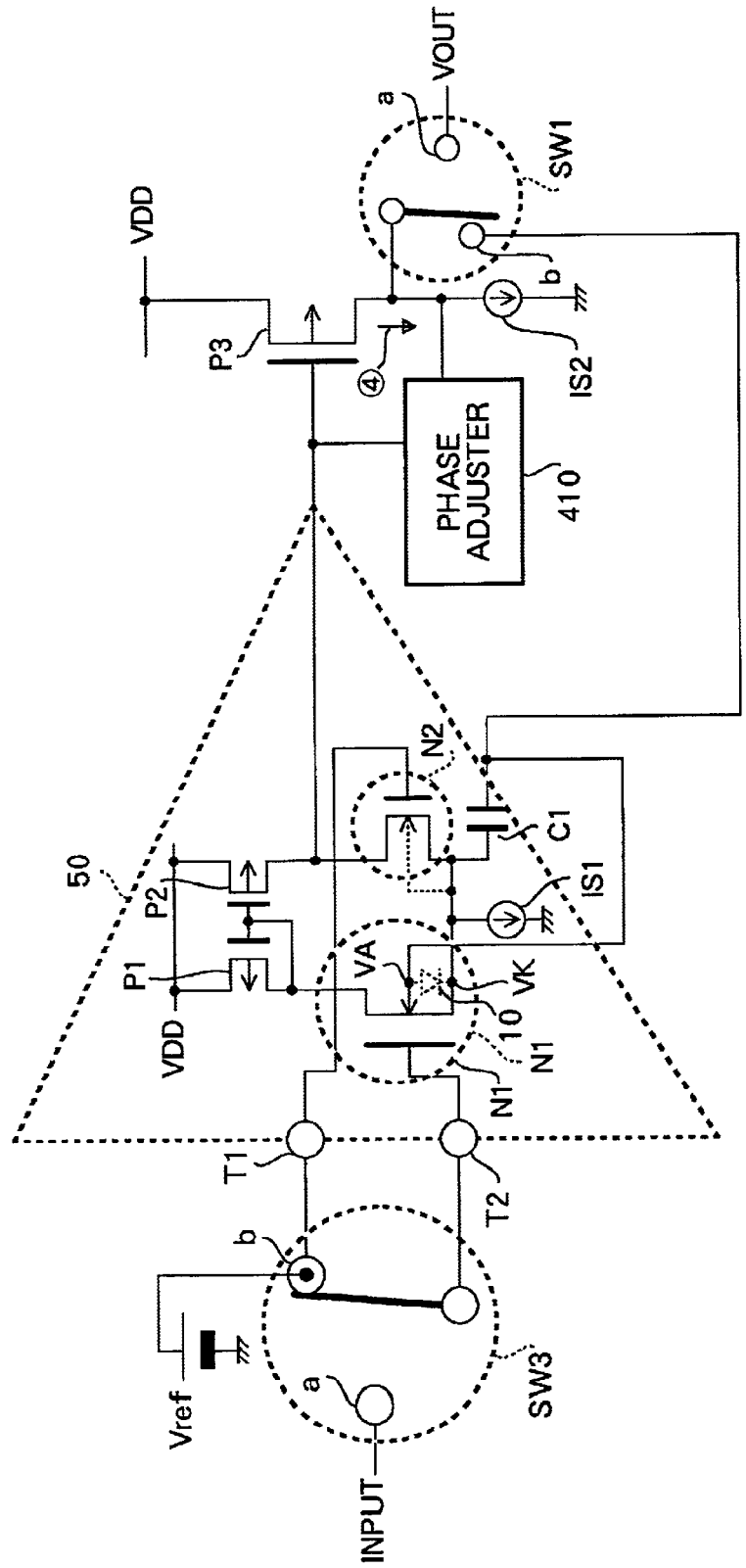
FIG. 6 is a circuit diagram illustrating an operation of preventing a parasitic diode from turning ON by providing the differential pair transistors (N1, N2) of the comparator with an offset canceling function shown in FIG. 1 of different sizes (channel conductance) (by setting the size of N1 twice the size of N2).

Under such a condition (Vin1=Vin2+α and the offset between the right and left systems is zero), suppose a case where switch Sw3 is changed to the b side and Vin1 =Vin2 is forcibly set as shown in FIG. 6.

Vin1 should originally be higher than Vin2 by α.

Here, as shown in FIG. 6, suppose a case where switch SW3 is changed to the b side and then the differential pair transistors N1 and N2 are forced to have the same gate voltage, that is, Vin1=Vin2 is set.

It can be assumed that with respect to the state in which the right and left systems of the differential circuit are balanced (hereinafter referred to as "stationary state"), the gate voltage of left differential pair transistor N1 is relatively lower than the gate voltage of right differential pair transistor N2 by α.

That is, with regard to the input voltage of the differential circuit, if an offset of −α is given to Vin1, an offset of +α is generated at the output voltage of source-grounded transistor P1.

On the contrary, suppose a condition: Vin1−α=Vin2 is given, and Vin1=Vin2 is forcibly set. Then, the gate voltage of differential pair transistor N1 is higher than the stationary state by +α.

Therefore, an offset of −α is generated at the output voltage of source-grounded transistor P1.

The present invention will positively employ techniques for intentionally giving an offset from an initial state.

That is, the present invention adopts design such that the size of transistor N1 is bigger than the size of N2 giving a difference in current capacities from the beginning. This prevents a parasitic diode from turning ON and makes it possible to change the substrate potential of transistor N1 in either the positive or negative direction without restrictions.

Designing the size of transistor N1 to be bigger than the size of N2 means forcibly setting Vin1=Vin2 and giving an offset of −α to the output voltage of source-grounded transistor P3 from the initial state on condition that Vin1−α=Vin2.

This will be explained more specifically using FIG. 6.

As shown in FIG. 6, the size of differential pair transistor N1 is twice the size of differential pair transistor N2.

To adjust the unbalance between the right and left currents of the differential circuit, suppose the substrate potential of differential pair transistor N1 has risen through negative feedback control.

At this time, if parasitic diode 10 (FIG. 6) between the substrate and source is turned ON, the substrate potential is clamped by voltage (VK+VF) obtained by adding forward voltage (VF) of diode 10 to source potential (VK) of transistor N1, preventing the substrate potential from further rising.

This would render the current adjustment performance of the MOS transistors using the substrate bias effect incomplete.

To prevent such a situation, the embodiment in FIG. 6 sets the size (channel conductance: W/L) ratio between differential pair transistors N1 and N2 to, for example, 2:1.

That transistor N1 has a higher current capacity means that transistor N1 can provide the same current flow with a lower input voltage than transistor N2.

Thus, this is equivalent to giving an initial condition: Vin1−α=Vin2 (α: initial offset voltage) between Vin1 (input voltage of transistor N1) and Vin2 (input voltage of other transistor N2).

In this case, as described above, a voltage offset of −α is generated at output voltage (output voltage of source-grounded transistor P3) Vout.

Since this offset voltage becomes the substrate bias of transistor N1, this means that the system is under negative feedback control in such a way that the substrate potential of transistor N1 in the initial state is always lower by −α compared to case where transistors N1 and N2 have the same size.

That is, negative feedback control is designed to work only in the direction in which the substrate potential of NMOS transistor N1 decreases (minus direction) from the beginning.

Thus, substrate potential VA (that is, anode potential of parasitic diode 10) of NMOS transistor N1 will not exceed the source potential (cathode potential of parasitic diode 10), and therefore parasitic diode 10 will never turn ON.

Figure 7:
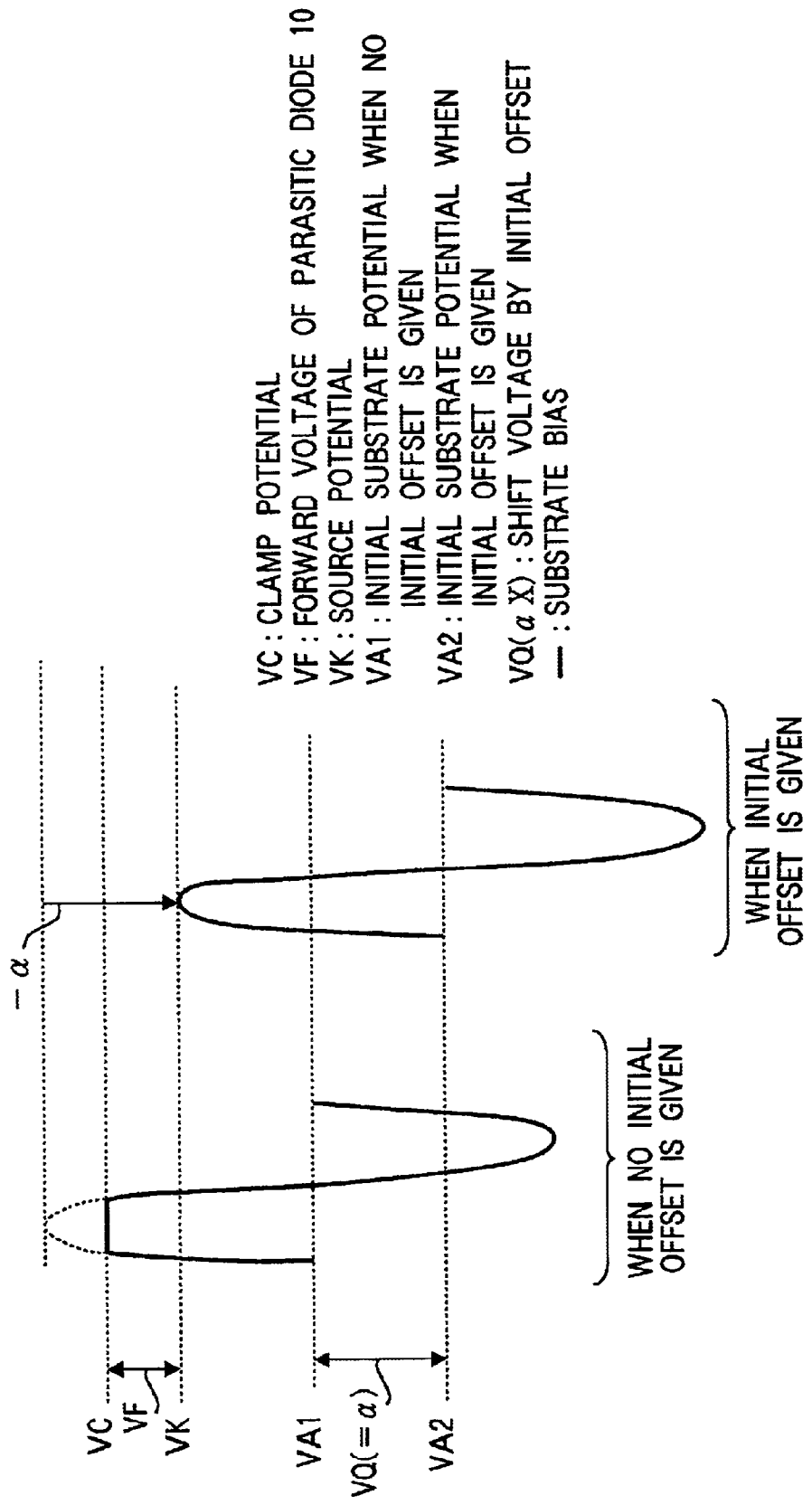
FIG. 7 illustrates the reason that the parasitic diode does not turn ON while a substrate bias is under negative feedback control in the comparator in FIG. 6.

FIG. 7 illustrates a mutual relationship between substrate potential (VA), source potential (VK) and clamp potential.

A change of the substrate bias when no initial offset (α) is given is shown on the left side of FIG. 7. When the substrate bias is increased, the potential is clamped at clamp potential VC (VK+VF) preventing any further change.

On the other hand, when an initial offset (α) is given, the substrate potential is shifted toward the minus side by VQ (equivalent to above-described offset voltage (α), and therefore parasitic diode 10 will not turn ON even if the substrate bias swings to the limit of the dynamic range. Thus, the substrate potential will never be clamped.

That is, since there is no possibility of clamp by a parasitic diode, the level of the negative feedback control signal can change within a predetermined dynamic range without any restrictions.

Thus, the substrate bias is always adjusted through appropriate negative feedback control.

By the way, as in the case of the circuit in FIG. 1, capacitor C1 in FIG. 6 functions as a DC cut capacitor preventing the substrate bias of NMOS transistor N1 from influencing the source potential or the substrate potential of NMOS transistor N2 and even after the offset is adjusted and switches SW1 and SW3 are changed to the a terminal side, capacitor C1 also functions as a holding capacitor to keep supplying an adjusted voltage to the substrate of NMOS transistor N1 for at least a predetermined time.

Figure 8:
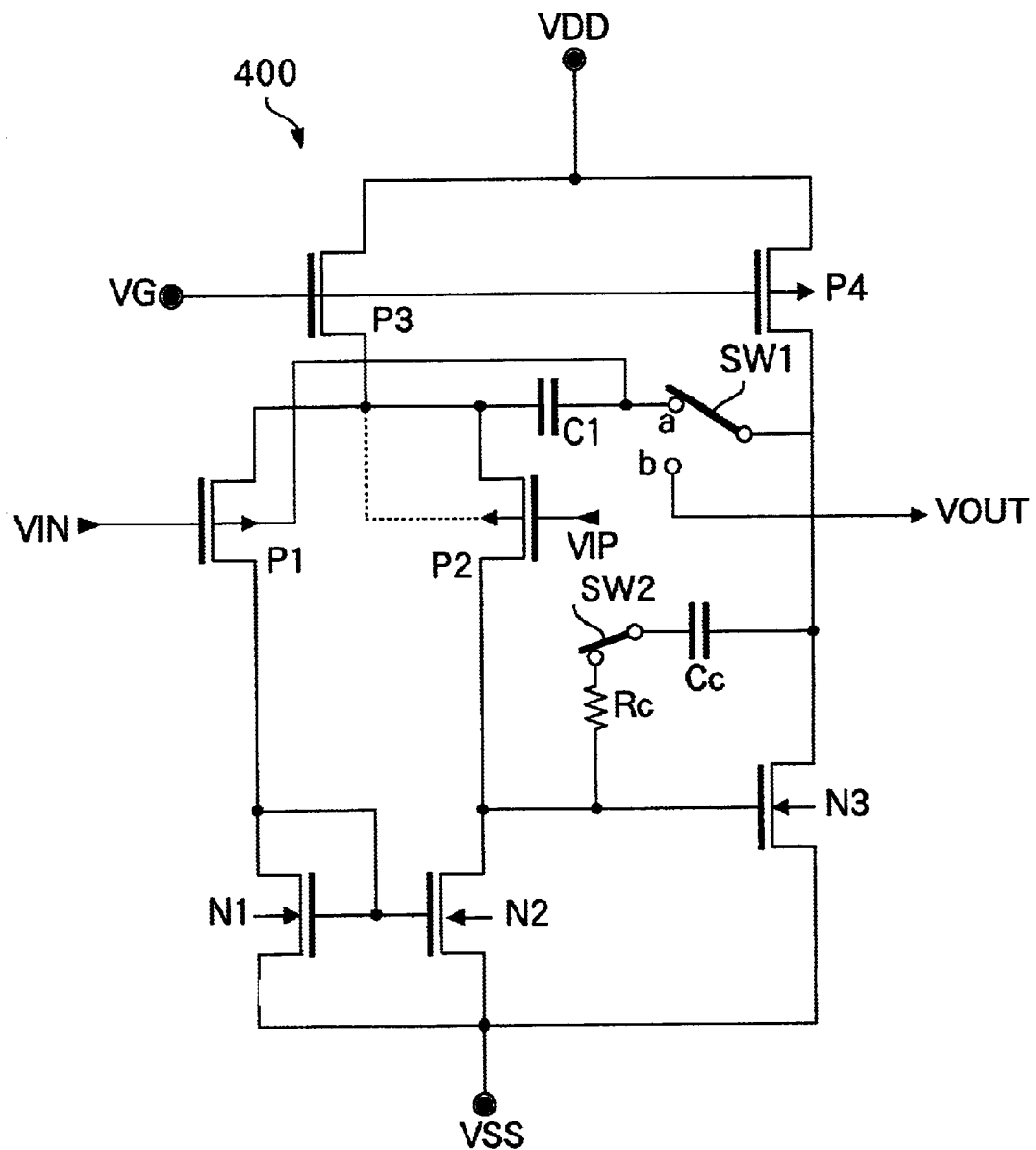
FIG. 8 is a circuit diagram showing another configuration example (example of a modified conductive type of transistors) of the comparator with an offset canceling function of the present invention.

FIG. 8 shows a comparator with the input stage differential pair transistors constructed of PMOS transistors.

The conductive type of transistors is opposite to that of the circuits in FIG. 1 to FIG. 6, but the comparator has the same basic function. The circuit operates in the same way as the circuits in FIG. 1 to FIG. 6.

(Embodiment 2)

This embodiment cancels the input/output offset of the D/A converter included in the CDMA transmitter using the offset canceling function of the aforementioned embodiment.

Figure 9A:
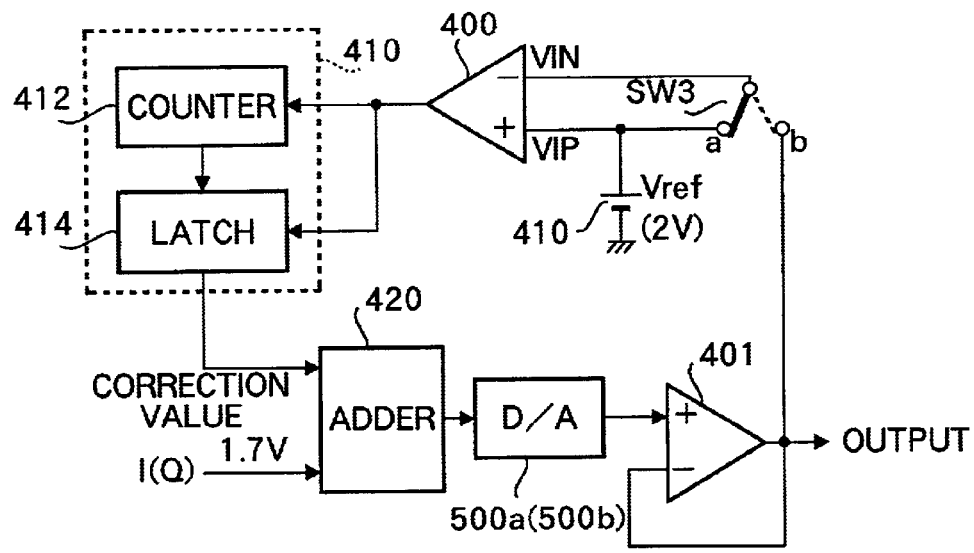
FIG. 9A is a circuit diagram showing a configuration example of an offset canceller of a D/A conversion apparatus.
Figure 9B:
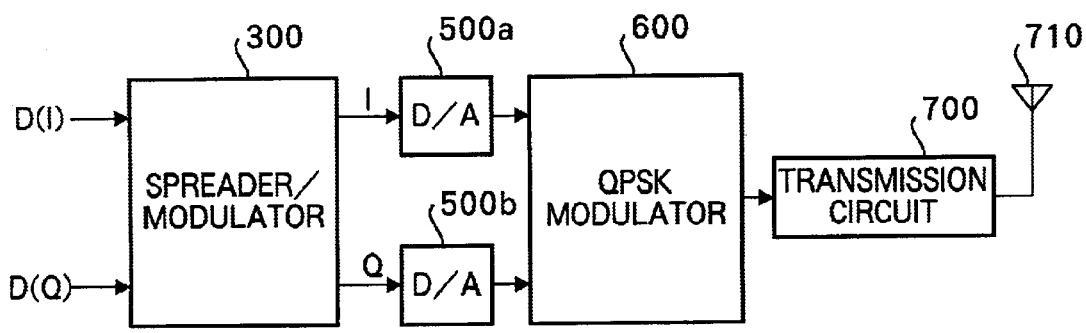
FIG. 9B is a block diagram showing a configuration of key components of a CDMA transmitter.

FIG. 9A is a circuit diagram showing a circuit configuration for canceling an offset of a D/A converter. FIG. 9B is a block diagram showing a configuration of key components of a CDMA transmitter.

As shown in FIG. 9B, the CDMA transmitter converts two types of transmission data, I (in-phase) and Q (quadrature), output from spreader/modulator 300 to analog signals by D/A converters 500a and 500b respectively and transmits the signals from antenna 710 through QPSK modulator 600 and transmission circuit 700.

To prevent any phase error from occurring in the I and Q signals at this time, both D/A converters 500a and 500b must have identical input/output characteristics.

Thus, respective input/output offsets of D/A converters 500a and 500b are canceled using a negative feedback circuit as shown in FIG. 9A to match the input/output characteristics of both of the D/A converters.

Here, comparator 400 with an offset function, which has been described in the foregoing embodiment, is used as a comparator.

Before canceling an offset of the D/A converter, switch SW3 provided in the input stage of comparator 400 is set to the a terminal side to cancel the offset between right and left currents.

Then, switch SW3 is changed to the b side. Here, switch SW1 in FIG. 1 (FIG. 2 to FIG. 6) is also changed to the a side at the same time and switch SW2 is left open.

Hereafter, during a period during which an adjusting voltage is retained in capacitor C1 of the circuit in FIG. 1 (FIG. 2 to FIG. 6) and the offset of the comparator is canceled, an operation of canceling the input/output offset of D/A converter 500a (500b) is carried out.

That is, when there is an offset between the input and output of the D/A converter, a correction value for canceling the offset is output from correction value generation circuit 410 and the correction value is given to the input signal of adder 420.

An outline of the operation will be explained below.

First, data corresponding to a 1.7 V DC signal is input to adder 420, for example. At this time, counter 412 starts counting in synchronization with the data input of 1.7 V.

Latch circuit 414 gives the count value output from counter 412 to adder 420 as it is until the output signal of comparator 400 is inverted to a low level.

Since the correction value given to the adder is initially "0", the 1.7 V input is given to D/A converter 500a (500b) as it is.

The converted output of D/A converter 500a (500b) is impedance-converted by voltage follower 401 and given to the inversion terminal of comparator 400. The non-inversion terminal of comparator 400 is given reference voltage Vref (here, suppose 2 V).

Since the potential of the non-inversion terminal is higher, the output of comparator 400 is a high level, and so the count value of counter 412 is given to adder 420 and added to the input signal.

The same operation is repeated and when the output of D/A converter 500a (500b) exceeds Vref (2 V), the output of comparator 400 is inverted to a low level, which resets counter 412. Furthermore, the counter output at that time is retained in latch 414.

As a result, both the input and output of D/A converter 500a (500b) are unified to Vref (=2 V), and the offset is canceled.

(Embodiment 3)

Figure 10:
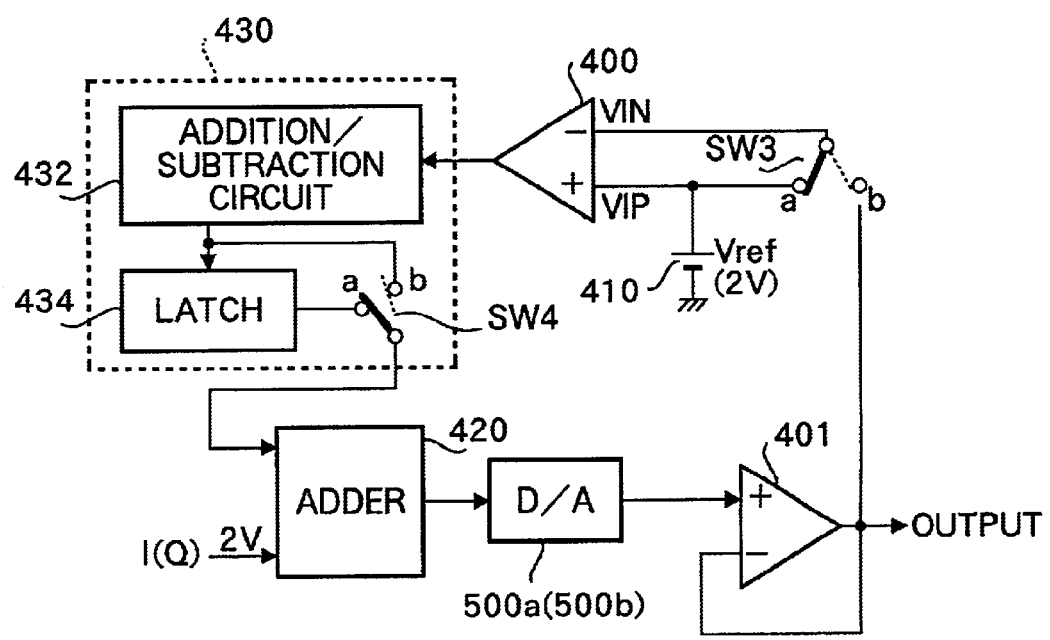
FIG. 10 is a circuit diagram showing another configuration example of the offset canceller of the D/A conversion apparatus.

FIG. 10 is a circuit diagram showing a configuration of a circuit to cancel offsets of a D/A converter of this embodiment.

The basic operation is the same as that in FIG. 9A. However, this embodiment uses addition/subtraction circuit 432 in correction value generation circuit 430. Switch SW4 is initially connected to the b terminal side.

Here, data equivalent to a 2 V DC voltage, which is the same as reference voltage Vref of comparator 400, is given as the input of adder 420. The initial value output from the addition/subtraction circuit is "0".

Comparator 400 compares reference value Vref (=2V) and the input signal and if the input signal is larger, addition/subtraction circuit 432 subtracts a certain value (value equivalent to a predetermined step width).

On the contrary, if the input signal is smaller, addition/subtraction circuit 432 adds a certain value.

Thus, the loop goes on so as to make up for the offset in the input/output characteristic of D/A converter 500a (500b). When the input and the output almost match (the feedback value converges to the reference value), comparator 400 starts to output high/low levels alternately.

When the comparator is in such a condition, switch SW4 is changed to the a terminal side and a correction value retained in latch 434 is supplied to adder 420. This causes the input and output of D/A converter 500a (500b) to be set to Vref (=2 V). This cancels the input/output offset.

The configuration in FIG. 10 uses an up-counter (or down-counter). Therefore, it is necessary to provide an offset between the input signal value and the comparator reference value (Vref) beforehand and determine either an addition or subtraction as the direction in which the offset is canceled.

At this time, there is a restriction that the offset to be given to the input signal as the initial condition should be determined with a sufficient margin compared to an offset of the D/A converter which is actually generated (that is, the initial value of the input signal should be determined with a sufficient margin).

On the contrary, the configuration of this embodiment is free of such a restriction, hence easy to use.

(Embodiment 4)

Figure 11:
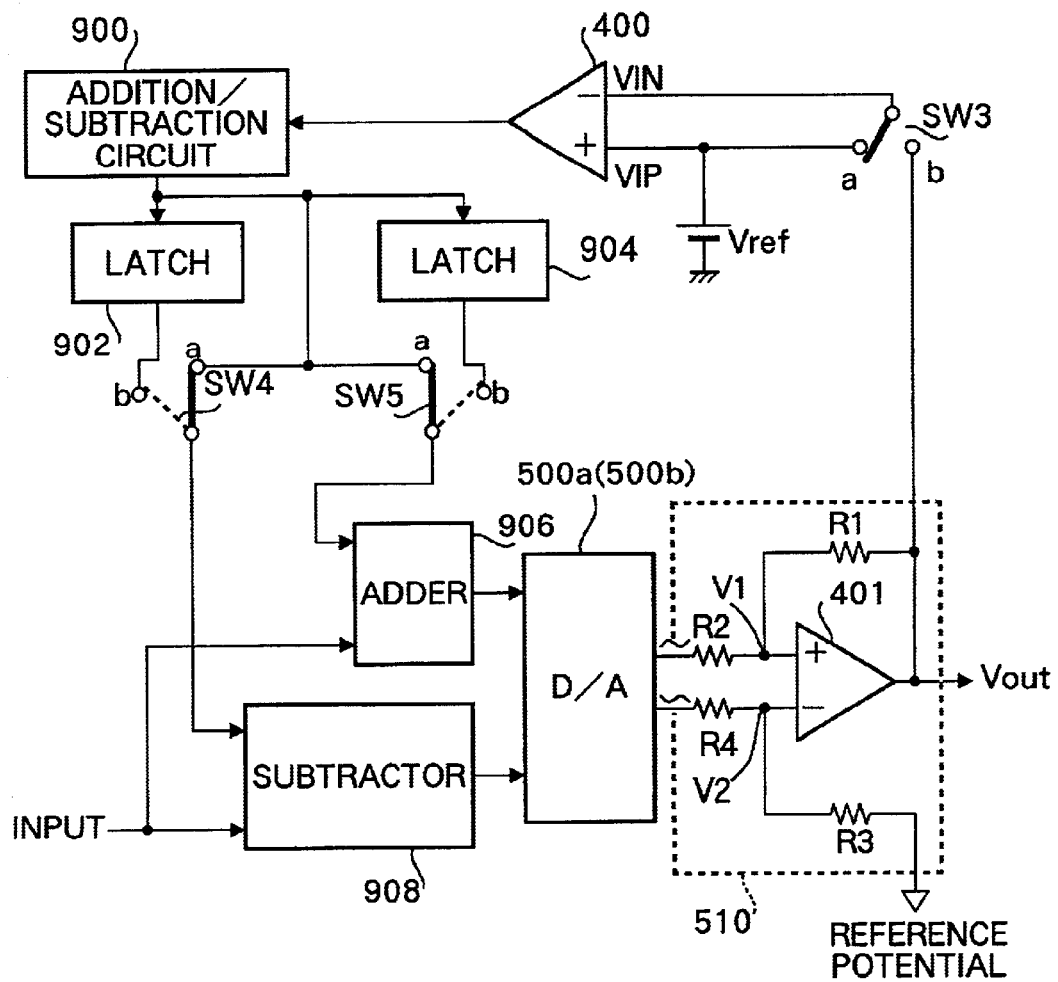
FIG. 11 is a circuit diagram showing another configuration example of the offset canceller of the D/A conversion apparatus.

FIG. 11 is a circuit diagram showing a configuration of a semiconductor integrated circuit apparatus according to Embodiment 4 of the present invention.

The basic operation of this embodiment is also the same as that of the foregoing embodiments.

However, this embodiment adopts a configuration with D/A converter 500a (500b) having differential output. Then, the differential output is returned to a single output by differential/single converter 510.

This configuration doubles the dynamic range of the D/A conversion output, and so the accuracy of adjusting (canceling) the offset also doubles.

To use this resolution as is, two latches 902 and 904 are also provided.

Before D/A converter 500a (500b), adder 906 or subtractor 908 is provided. The adder or subtractor carries out a calculation only for the positive phase side or negative phase side (complementary operation) respectively.

Such a configuration allows an offset of the entire D/A converter to be canceled with accuracy twice the bit accuracy of the D/A converter.

However, when the resolution doubles, the follow-up speed by negative feedback loop control slows down because a step change at a time becomes smaller.

Thus, switches SW4 and SW5 are initially set to the a side and the loop is operated at normal speed and switches SW4 and SW5 are changed to the b terminal side near the converging point and negative feedback control is carried out with high resolution.

This will be explained more specifically.

First, a desired value is input as a digital signal.

A desired value is input as the digital signal.

The value input is a value to be a reference value for when the waveform is output later. Normally, a central value of the waveform to be output is input.

When the input value is positive, the input value passes through the adder. When the input value is negative, the input value passes through the subtractor. In the initial stage, switch SW4 is changed to the a side to connect addition/subtraction circuit 900.

The initial value can be set to any desired value, but normally set to zero. Therefore, input values are initially output from adder 906 and subtractor 908 as they are.

The output values pass through D/A converter 500a (500b) and differential single conversion circuit 510 and an offset is generated at the output.

Comparator 400 compares the output value with a reference potential (expected value), decides whether the output value is higher or lower than the expected value and outputs the result.

When the output is decided to be higher, addition/subtraction circuit 900 subtracts a certain value from the output. On the contrary, when the output is decided to be lower, addition/subtraction circuit 900 adds a certain value to the output.

Additions and subtractions are carried out at predetermined timing.

The output of the addition/subtraction circuit is passed through switch SW4 and added to the digital input value by the adder.

This operation is repeated and after the offset is cancelled, the comparator outputs "H" and "L" alternately, the addition/subtraction circuit repeats additions and subtractions and the output value is virtually settled to a certain value. In this state, the offset is canceled at the output of the D/A converter.

However, only the offset of the bit accuracy of the D/A converter is canceled in this condition.

Thus, switches SW4 and SW5 are changed to the a side.

Then, the output of addition/subtraction circuit 900 in this condition is incorporated into latch 1 that handles a negative phase signal and switch SW4 is connected to the latch output. Thus, the value canceling the offset is retained and subtracted by subtractor 908. The offset cancellation operation continues for the positive phase signal and an offset cancellation operation is carried out with accuracy twice the bit accuracy of the D/A converter.

Adopting this configuration makes it possible to perform offset cancellation operation with accuracy twice the bit accuracy of the D/A converter and further shorten the offset cancellation time.

(Embodiment 5)

Figure 12:
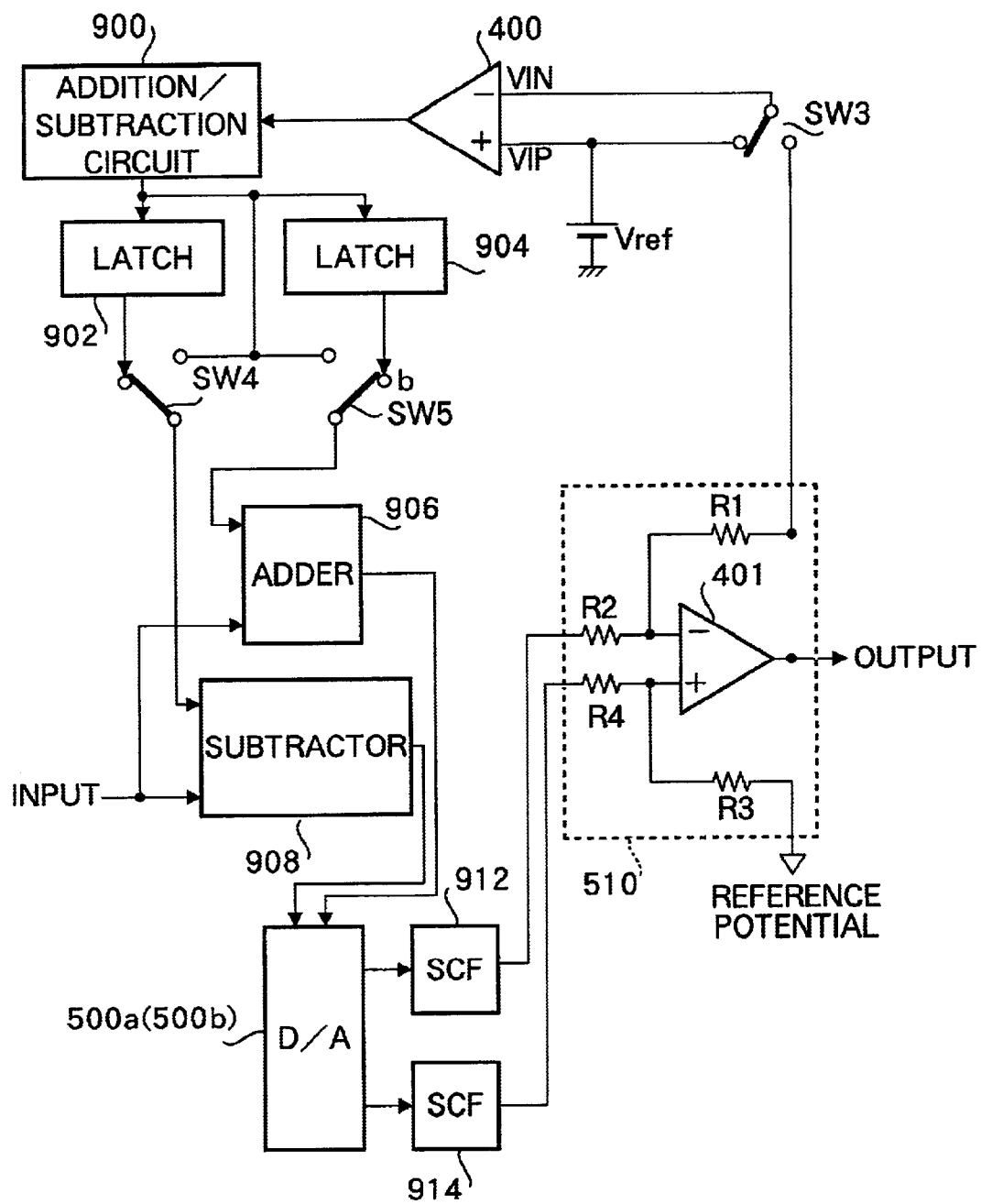
FIG. 12 is a circuit diagram showing another configuration example of the offset canceller of the D/A conversion apparatus.

FIG. 12 is a circuit diagram showing a configuration of a circuit for canceling an offset of the D/A converter according to this embodiment.

This circuit has almost the same configuration as that of the circuit of the aforementioned embodiments.

However, the circuit in FIG. 12 is characterized in that switched capacitor filters (SCF) 912 and 914 are used as the post filters of D/A converter 500*a* (500*b*).

The filter characteristic determines the gain of a negative feedback loop and so the response of the filter may be slow at times, and there may be cases where a desired speed cannot be secured through negative feedback control.

In such a case, the SCF is useful because it can easily change the filter characteristic by only changing the clock used to a high-speed clock.

In the circuit in FIG. 12, the operating frequencies of the SCF 912 and 914 are set to high values. According to the characteristic of an SCF, when its operating frequency is increased, the delay time is decreased, which decreases the delay time during output from the D/A conversion section.

An offset cancellation operation of the D/A converter is performed in such a condition. With an LPF inserted, an offset cancellation time is normally extended, but a high-speed operation of the SCF prevents such a problem.

After offset cancellation is completed, the operating frequency of the SCF is returned to the original frequency and used as an LPF with a desired operating frequency.

Figure 13:
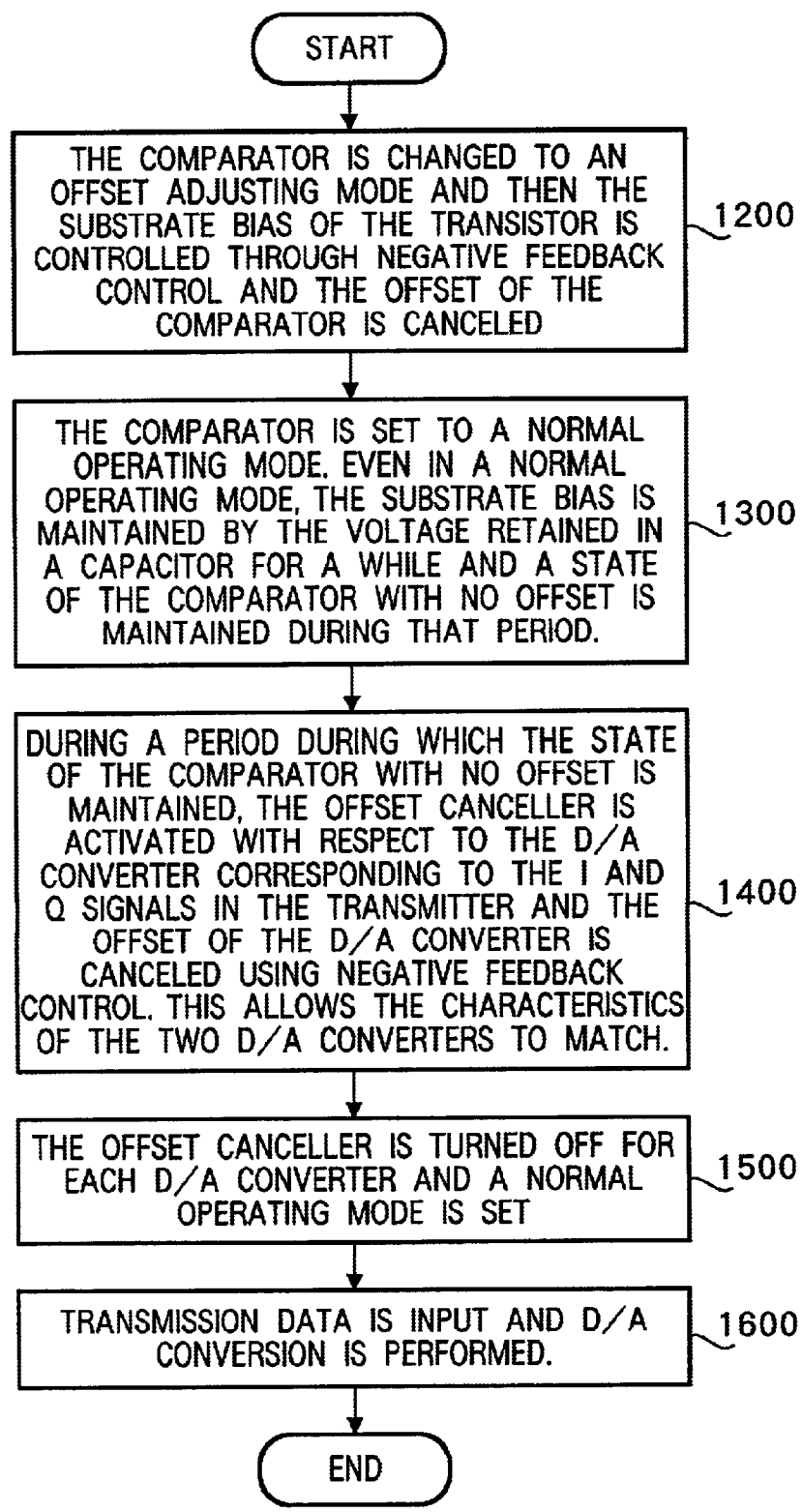
FIG. 13 is a flow chart showing a basic operation procedure for canceling an offset of the D/A conversion apparatus.
Figure 14:
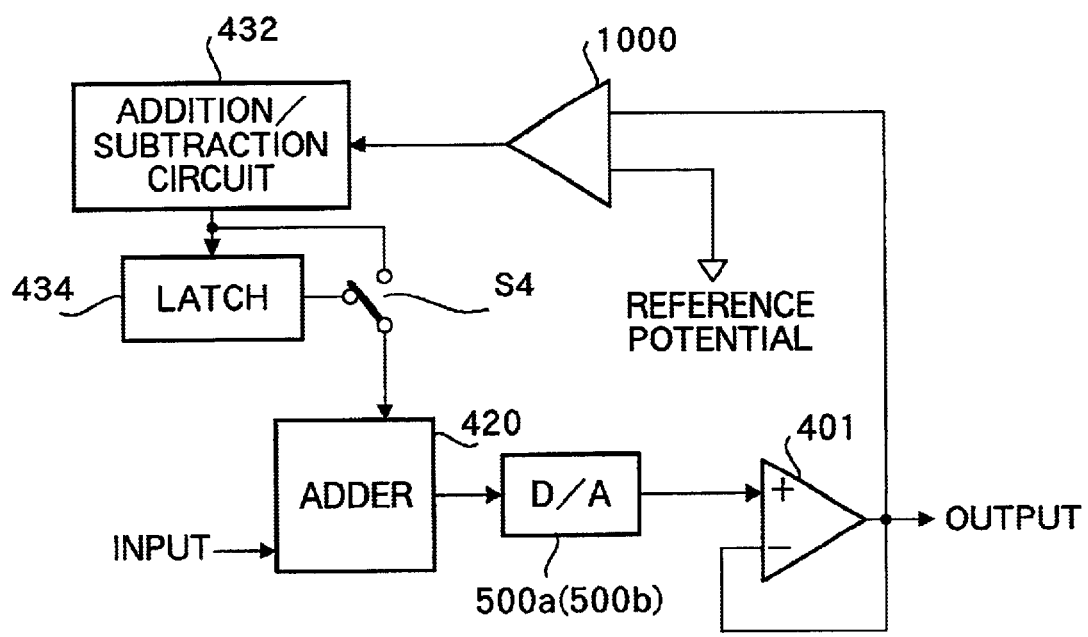
FIG. 14 is a circuit diagram showing a modification example of the offset canceller of the D/A conversion apparatus.
Figure 15:
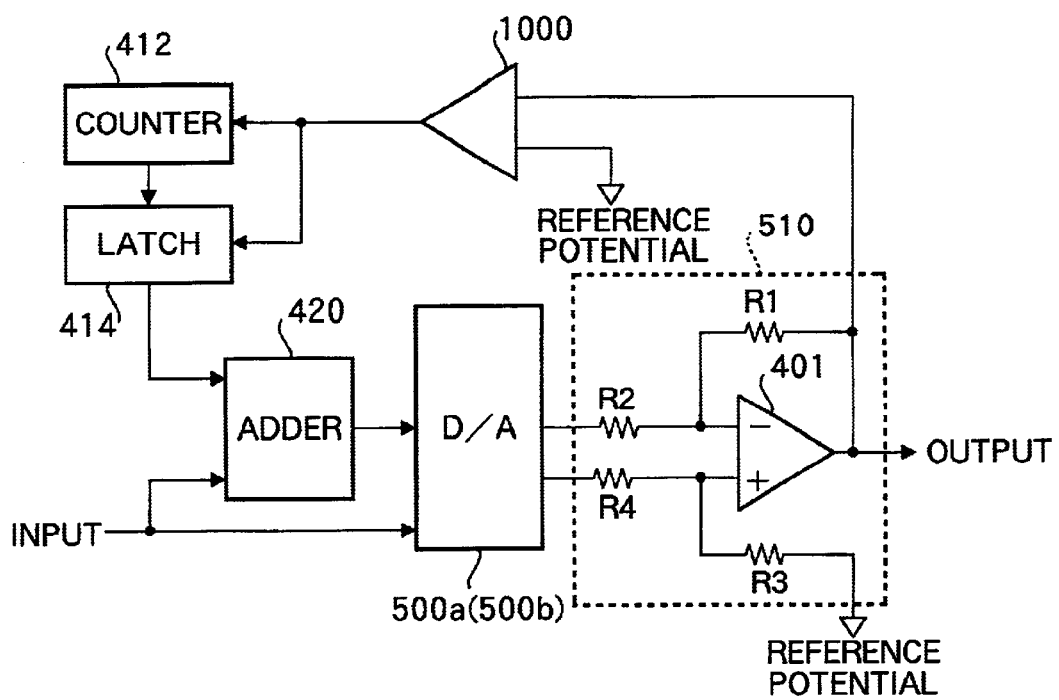
FIG. 15 is a circuit diagram showing another modification example of the offset canceller of the D/A conversion apparatus.
Figure 16:
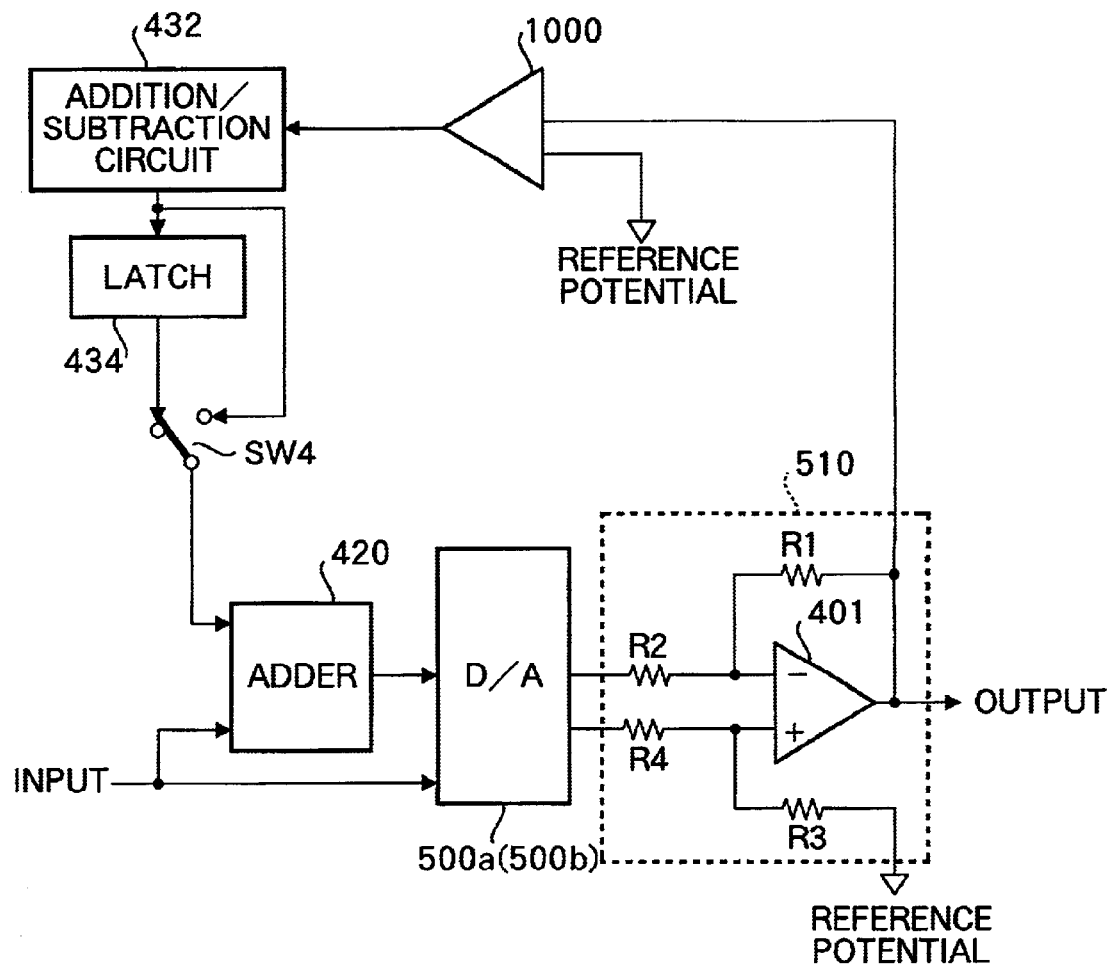
FIG. 16 is a circuit diagram showing another modification example of the offset canceller of the D/A conversion apparatus.
Figure 17:
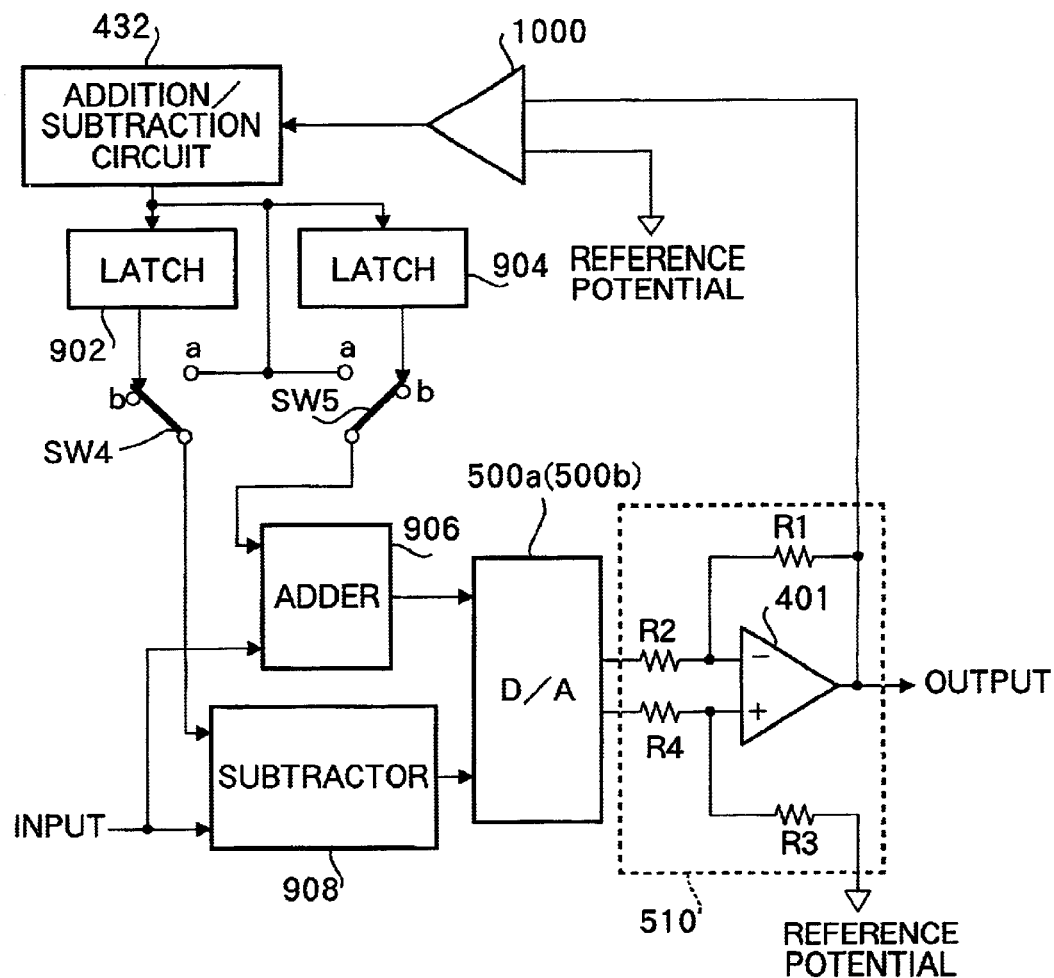
FIG. 17 is a circuit diagram showing another modification example of the offset canceller of the D/A conversion apparatus.

The common features of the operation for offset cancellation of the D/A converter are summarized as shown in FIG. 13.

That is, the comparator is changed to an offset adjusting mode first and then the substrate bias of the transistor is controlled through negative feedback control and the offset of the comparator is canceled (step 1200). This operation was explained in detail using FIG. 1 to FIG. 8 and with reference to Embodiment 1.

Then, the comparator is set to a normal operating mode (step 1300).

Even in a normal operating mode, the substrate bias is maintained by the voltage retained in capacitor C1 (FIG. 1 to FIG. 6) for a while and a state of the comparator without any offset is maintained during that period.

Then, during a period during which the state of the comparator with no offset is maintained, the offset canceller is activated with respect to the D/A converter corresponding to the I and Q signals in the transmitter and the offset of the D/A converter is canceled using negative feedback control (step 1400). This allows the characteristics of the two D/A converters to match.

Then, the offset canceller is turned OFF for each D/A converter, a normal operating mode is set (step 1500), transmission data is input and D/A conversion is performed (step 1600).

The circuits for canceling the offsets of the comparator and D/A converter are all integrated on a single semiconductor substrate.

Then, not only in the IC testing stage, but also when the user actually uses the IC, an offset is canceled through the above-described circuit operation as appropriate. This allows CDMA transmission without phase errors.

The above-described embodiment uses a comparator with an offset canceling function.

However, if the offset of the comparator is small, it is not impossible to use ordinary comparator 1000 (with no offset canceling function) as shown in FIG. 14 to FIG. 17.

As described above, the present invention can implement a comparator in a simple configuration having an offset canceling function, which automatically adjusts offsets.

Furthermore, using this comparator to perform processing of canceling offsets of the D/A converter allows adjustments with fewer errors.

The present invention can also shorten an offset cancellation time and improve the ease in the design of ICs (degree of freedom of design).

The present invention is not limited to the above described embodiments, and various variations and modifications may be possible without departing from the scope of the present invention.

This application is based on Japanese Patent Application No. 2001-190149 filed on Jun. 22, 2001, entire content of which is expressly incorporated by reference herein.

What is claimed is:

1. A comparator with an offset compensation function comprising:

a differential circuit provided with differential pair transistors each made up of an MOS transistor and a load circuit;

an output buffer circuit that inverts the phase of an output signal of said differential circuit; and a feedback path for, when a same voltage is given to both of said differential pair transistors, feeding back the output signal of said output buffer circuit as a substrate bias voltage of either of said differential pair transistors.

2. The comparator according to claim 1, wherein, of said differential pair transistors, the size of the MOS transistor to which the output signal of said output buffer circuit is fed back as a substrate potential is designed to be greater than the size of the other MOS transistor so as to generate an initial offset to prevent a parasitic transistor which exists between the substrate and source of the MOS transistor from turning ON.

3. A D/A conversion apparatus comprising:

a circuit for detecting an amount of input/output offset using the comparator according to claim 1; and a circuit for compensating for said detected input/output offset.

4. A comparator with an offset compensation function capable of switching between a normal operating mode and offset canceling mode and integrated on a semiconductor substrate, comprising:

transistors forming a differential pair;

a circuit for equalizing the gate potentials of said differential pair transistors only in said offset canceling mode;

a current mirror that operates as a load of said differential pair transistors;

an output stage circuit that includes a first transistor which receives a single end output of said current mirror and a second transistor which is of a conductive type opposite to that of this first transistor;

a phase adjustment circuit that is connected between the gate and drain of said first transistor only in said offset canceling mode;

a path for giving the voltage of the output terminal of said output stage circuit to the substrate of the transistor that receives an input signal out of said differential pair transistors; and a capacitance element that retains the voltage given to the substrate of the transistor that receives said input signal through said path even after said offset canceling mode is canceled.

5. The comparator according to claim 4, wherein an offset is given beforehand to current capacities of said differential pair transistors.

6. A D/A conversion apparatus with an offset compensation function comprising:

a D/A converter;

the comparator with an offset canceling function according to claim 4 that compares the output voltage of said D/A converter and a reference voltage; and an offset compensation circuit that compensates the input and output of said D/A converter based on the output of said comparator.

7. A D/A conversion apparatus with an offset compensation function using negative feedback loop control comprising:

a single input/differential output type D/A converter;

a differential/single conversion circuit that converts the differential output of said D/A converter to a single output;

the comparator with an offset canceling function according to claim 4 that compares the output voltage of said differential/single conversion circuit with a reference voltage; and an offset compensation circuit that compensates an offset between the input and output of said D/A converter based on the output of said comparator.

8. The D/A conversion apparatus according to claim 7, wherein the follow-up capability of said negative feedback control loop is made variable.

9. A D/A conversion apparatus with an offset compensation function, comprising:

a single input/differential output type D/A converter;

a switched capacitor filter that receives the differential outputs of said D/A converter as inputs;

a differential/single conversion circuit that converts the differential output which is output from said switched capacitor filter to a single output;

the comparator with an offset canceling function according to claim 4 that compares the output voltage of said differential/single conversion circuit with a reference voltage; and an offset compensation circuit that compensates for an offset between the input and output of said D/A converter based on the output of said comparator.

10. A CDMA-based radio transmitter that spreads/modulates a transmission signal, D/A-converts the spread/modulated signal and transmits through an antenna, comprising the D/A conversion apparatus with an offset compensation function according to claim 6 for converting said spread/modulated signal to an analog signal.

11. A method for compensating for an input/output offset of said D/A converter included in the D/A conversion apparatus according to claim 6, comprising the steps of:

changing said comparator to an offset canceling mode and canceling an offset of said comparator by controlling the substrate bias of either of said differential pair transistors through negative feedback control;

returning said comparator to a normal operating mode;

completing an adjustment for canceling an input/output offset of said D/A converter during a period during which the bias voltage for canceling said offset is retained by said capacitance element incorporated in said comparator.

* * * * *